(12) United States Patent
Kim et al.

(10) Patent No.: US 10,665,740 B2
(45) Date of Patent: May 26, 2020

(54) THIN FILM TYPE SOLAR CELL AND MANUFACTURING METHOD THEREFOR

(71) Applicant: JUSUNG ENGINEERING CO., LTD., Gwangju-si, Gyeonggi-do (KR)

(72) Inventors: Yong Hyun Kim, Gwangju-si (KR); Chang Kyun Park, Gwangju-si (KR); Young Gi Kim, Gwangju-si (KR); Duck Ho Kim, Gwangju-si (KR); Kyung In Min, Gwangju-si (KR); Sang Su Choi, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 32 days.

(21) Appl. No.: 15/735,599

(22) PCT Filed: Jun. 10, 2016

(86) PCT No.: PCT/KR2016/006207
§ 371 (c)(1),
(2) Date: Dec. 11, 2017

(87) PCT Pub. No.: WO2016/200216
PCT Pub. Date: Dec. 15, 2016

(65) Prior Publication Data
US 2019/0035959 A1    Jan. 31, 2019

(30) Foreign Application Priority Data

Jun. 11, 2015  (KR) .......................... 10-2015-0082632

(51) Int. Cl.
*H01L 31/0463* (2014.01)
*H01L 31/0224* (2006.01)
(Continued)

(52) U.S. Cl.
CPC ...... *H01L 31/0463* (2014.12); *H01L 31/0224* (2013.01); *H01L 31/022483* (2013.01);
(Continued)

(58) Field of Classification Search
CPC .................................................. H01L 31/0463
See application file for complete search history.

(56) References Cited

U.S. PATENT DOCUMENTS

| 6,506,260 B1 * | 1/2003 | Hiraishi ............ H01L 21/67046 134/1 |
| 2009/0217969 A1 | 9/2009 | Matsushima et al. |

(Continued)

FOREIGN PATENT DOCUMENTS

| JP | 2000114555 A | 4/2000 |
| JP | 2004140043 A | 5/2004 |

(Continued)

*Primary Examiner* — Daniel P Malley, Jr.
(74) *Attorney, Agent, or Firm* — Renaissance IP Law Group LLP (57) ABSTRACT

Disclosed is a thin film type solar cell which prevents short circuit from occurring between a first electrode and a second electrode due to a burr produced in a separation part, thereby preventing an output from being reduced. The thin film type solar cell includes a substrate, a first electrode disposed over the substrate and being apart from an adjacent first electrode by a first separation part, a semiconductor layer disposed over the first electrode and being apart from an adjacent semiconductor layer by a contact part and a second separation part, and a second electrode disposed over the semiconductor layer and being apart from an adjacent second electrode by the second separation part. The semiconductor layer contacts the substrate through the first separation part, and the second electrode contacts the first electrode through the contact part. A height of a burr produced in the second (Continued)

separation part is lower than a height between the first electrode and the second electrode.

10 Claims, 6 Drawing Sheets

(51) Int. Cl.
 *H01L 31/18* (2006.01)
 *H01L 31/0445* (2014.01)
 *H01L 31/0465* (2014.01)
 *H01L 31/0376* (2006.01)

(52) U.S. Cl.
 CPC .... *H01L 31/03762* (2013.01); *H01L 31/0445* (2014.12); *H01L 31/0465* (2014.12); *H01L 31/18* (2013.01); *Y02E 10/50* (2013.01); *Y02P 70/521* (2015.11)

(56) References Cited

U.S. PATENT DOCUMENTS

| 2010/0047954 | A1* | 2/2010 | Su | B26F 3/002 |
| | | | | 438/61 |
| 2010/0267192 | A1* | 10/2010 | Mei | B08B 3/08 |
| | | | | 438/96 |
| 2012/0174973 | A1* | 7/2012 | Kwon | H01L 31/022425 |
| | | | | 136/256 |
| 2015/0357207 | A1* | 12/2015 | Peethala | H01L 21/30604 |
| | | | | 156/345.21 |

FOREIGN PATENT DOCUMENTS

| JP | 2007305877 A | 11/2007 |
| JP | 2012151282 A | 8/2012 |
| TW | 200929584 A | 7/2009 |
| TW | 201003957 A | 1/2010 |

* cited by examiner

THIN FILM TYPE SOLAR CELL AND MANUFACTURING METHOD THEREFOR

BACKGROUND

Technical Field

The present invention relates to a thin film type solar cell and manufacturing method therefor.

Discussion of the Related Art

Solar cells are devices that convert light energy into electrical energy, based on the characteristic of a semiconductor. The solar cells have a P-N junction structure where a positive (P)-type semiconductor and a negative (N)-type semiconductor are joined to each other. When sunlight is incident on a solar cell, a hole (+) and an electron (−) are generated in a semiconductor by energy of the incident sunlight. At this time, due to an electric field which is generated in a P-N junction, the hole (+) moves to a side opposite to a P-type semiconductor, and the electron (−) moves to an N-type semiconductor, thereby generating an electric potential. The solar cell generates power, based on the electric potential.

The solar cells are categorized into thin film type solar cells and wafer type solar cells. The thin film type solar cells are solar cells which are manufactured by forming a semiconductor on a substrate such as glass in a thin film type, and the wafer type solar cells are solar cells which are manufactured by using a silicon wafer itself as a substrate.

The wafer type solar cells are rather better in efficiency than the thin film type solar cells. However, in the wafer type solar cells, there is a limitation in minimizing a thickness in a manufacturing process, and since a high-cost semiconductor substrate is used, the manufacturing cost increases. Particularly, since a wafer is opaque, there is a limitation in applying the wafer type solar cells to a structure requiring daylight like windows of buildings. On the other hand, the thin film type solar cells are rather lower in efficiency than the wafer type solar cells. However, the thin film type solar cells may be manufactured to a thin thickness, and low-cost materials are used, thereby reducing the manufacturing cost. Particularly, since a transparent glass substrate is used, it is suitable to apply the thin film type solar cells to a light-transmitting structure (a structure including a see-through solar cell) like windows of buildings.

The thin film type solar cells may each include a second electrode, a semiconductor layer, and a first electrode, and moreover, may each include a hole which is formed by using a laser and separates a plurality of the semiconductor layers. The hole may be formed by the laser passing through the second electrode and the semiconductor layer. However, a burr (byproduct/remaining material) of the second electrode or a particle of the semiconductor layer can remain in the hole, and in this case, the second electrode is short-circuited with the first electrode, causing a leakage current. For this reason, outputs of the thin film type solar cells are reduced.

DISCLOSURE

Technical Problem

The present invention is directed to provide a thin film type solar cell and manufacturing method therefor that substantially obviates one or more problems due to limitations and disadvantages of the related art.

An aspect of the present invention is directed to provide a thin film type solar cell and manufacturing method therefor, which prevent an output from being reduced.

Technical Solution

To achieve these and other advantages and in accordance with the purpose of the invention, as embodied and broadly described herein, there is provided a thin film type solar cell including: a substrate; a first electrode disposed over the substrate and being apart from an adjacent first electrode by a first separation part; a semiconductor layer disposed over the first electrode and being apart from an adjacent semiconductor layer by a contact part and a second separation part, the semiconductor layer contacting the substrate through the first separation part; and a second electrode disposed over the semiconductor layer and being apart from an adjacent second electrode by the second separation part, the second electrode contacting the first electrode through the contact part, wherein a height of a burr produced in the second separation part is lower than a height between the first electrode and the second electrode.

The first electrode, the semiconductor layer, and the second electrode may be being apart from each other by a third separation part.

A height of a burr produced in the third separation part may be lower than a height between the substrate and the second electrode.

The first electrode, the second electrode, and the burr may each include ZnO.

In another aspect of the present invention, there is provided a method of manufacturing a thin film type solar cell including: forming a first electrode over a substrate to be apart from an adjacent first electrode by a first separation part; forming a semiconductor layer over the first electrode to be apart from an adjacent semiconductor layer by a contact part, the semiconductor layer contacting the substrate through the first separation part; forming a second electrode over the semiconductor layer to be apart from an adjacent second electrode by the second separation part, the second electrode contacting the first electrode through the contact part; and wet-etching a burr, produced in the second separation part, with a wet etchant including acetic acid.

The method may further include removing the wet etchant gotten on the burr by using water.

A height of the burr produced in the second separation part etched by the wet etchant may be lower than a height between the first electrode and the second electrode.

The method may further include: punching a hole in each of the first electrode, the semiconductor layer, and the second electrode with a laser to form a third separation part exposing the substrate; and wet-etching a burr, produced in the third separation part, with the wet etchant including acetic acid.

A height of the burr produced in the third separation part may be lower than a height between the substrate and the first electrode.

The first electrode, the semiconductor layer, and the second electrode may be apart from each other by the third separation part.

The forming of the first electrode may include: forming the first electrode over the substrate; and punching a hole in the first electrode with a laser to form the first separation part exposing the substrate.

The forming of the semiconductor layer may include: forming the semiconductor layer over the first separation part and the first electrode; and punching a hole in the semiconductor layer with a laser to form the contact part exposing the first electrode.

The forming of the second electrode may include: forming the second electrode over the contact part and the semiconductor layer; and punching a hole in each of the second electrode and the semiconductor layer with a laser to form the second separation part exposing the first electrode.

The wet-etching of the burr produced in the second separation part may include, if a mole ratio of water (H2O) to acetic acid (CH3COOH) of the wet etchant is 120, wet-etching the burr for 30 sec to 120 sec.

The wet-etching of the burr produced in the third separation part may include, if a mole ratio of water (H2O) to acetic acid (CH3COOH) of the wet etchant is 120, wet-etching the burr for 30 sec to 120 sec.

It is to be understood that both the foregoing general description and the following detailed description of the present invention are exemplary and explanatory and are intended to provide further explanation of the invention as claimed.

Advantageous Effects

According to the embodiments of the present invention, a burr (byproduct/remaining material) which is produced in the separation part may be wet-etched by using acetic acid. As a result, a height of the burr which is produced in the separation part may be lower than a height between the first electrode and the second electrode or a height between the substrate and the second electrode. Therefore, according to the embodiments of the present invention, the burr which is produced in the separation part prevents short circuit between the first electrode and the second electrode. Accordingly, according to the embodiments of the present invention, an output of the thin film type solar cell is prevented from being reduced.

DETAILED DESCRIPTION OF EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

<Thin Film Type Solar Cell>

Figure 1:
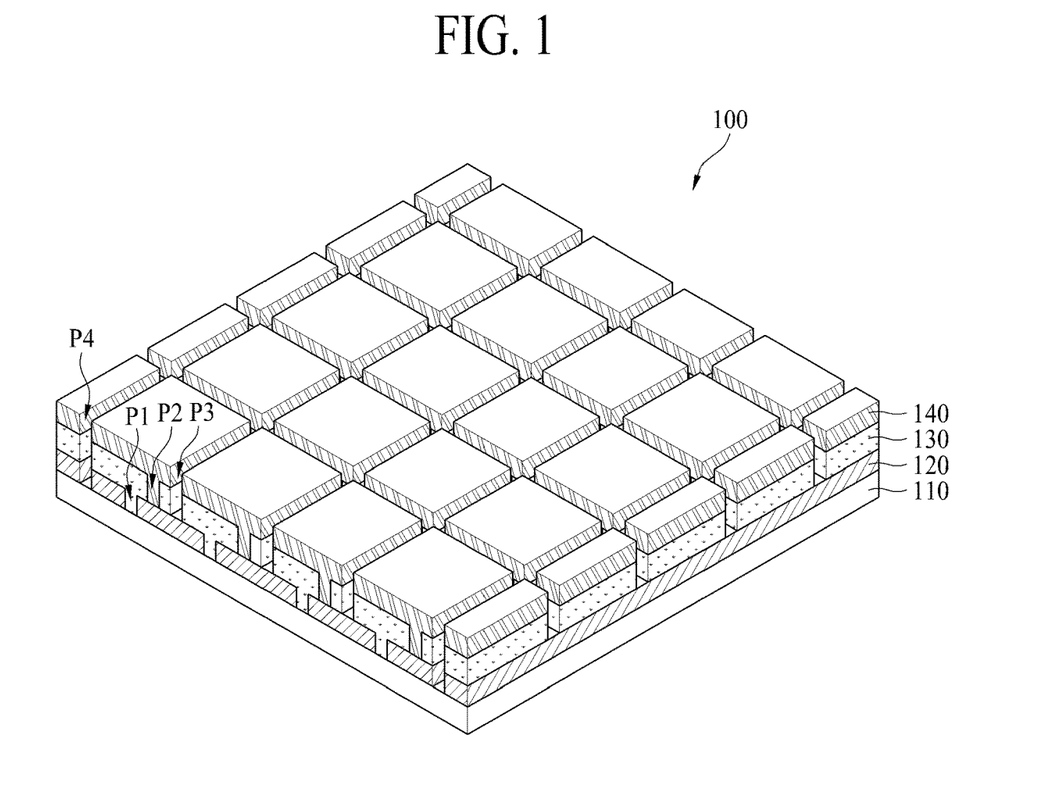
FIG. 1 is a perspective view illustrating in detail a thin film type solar cell according to an embodiment of the present invention.
Figure 2:
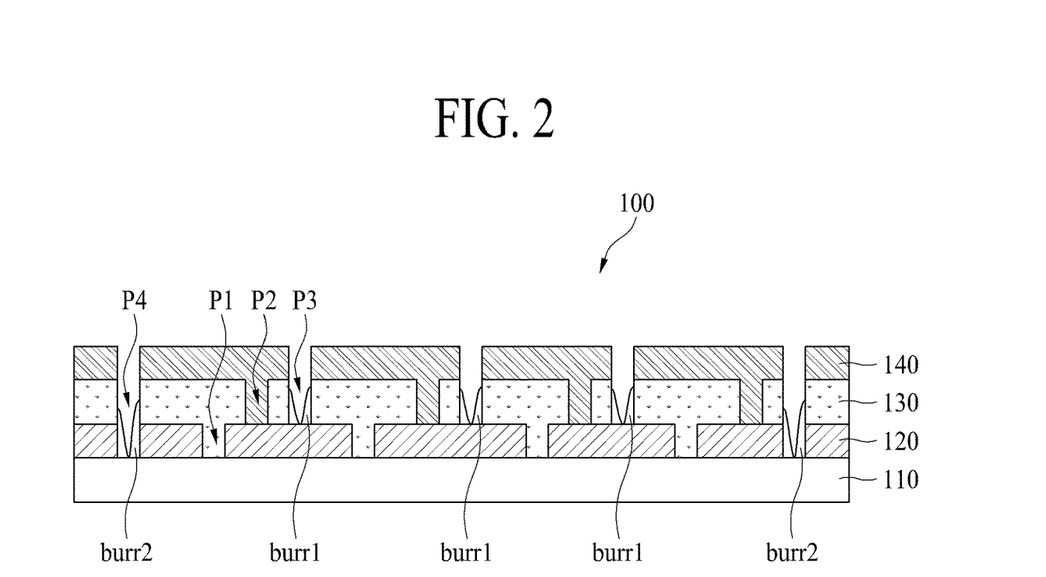
FIG. 2 is a cross-sectional view taken along line I-I' of FIG. 1.

FIG. 1 is a perspective view illustrating in detail a thin film type solar cell 100 according to an embodiment of the present invention. FIG. 2 is a cross-sectional view taken along line I-I' of FIG. 1.

Referring to FIGS. 1 and 2, the thin film type solar cell 100 according to an embodiment of the present invention may include a substrate 110, a first electrode 120, a semiconductor layer 130, and a second electrode 140.

The substrate 110 may be formed of transparent glass or transparent plastic.

The first electrode 120 may be formed on the substrate 110. The first electrode 120 may be provided in plurality. Adjacent first electrodes 120 among the plurality of first electrodes 120 may be apart from each other by a first separation part P1 therebetween. That is, the first separation part P1 may be a hole that passes through the first electrode 120 to expose the substrate 110. The first electrode 120 may be formed of transparent conductive oxide such as ZnO, ZnO:B, ZnO:Al, SnO2, SnO2:F, indium tin oxide (ITO), or the like.

The semiconductor layer 130 may be formed on the first electrode 120. In more detail, the semiconductor layer 130 may be formed on a surface opposite to a surface contacting the substrate 110 among surfaces of the first electrode 120. Also, the semiconductor layer 130 may also be formed in the first separation part P1. Therefore, the semiconductor layer 130 may contact the substrate 110 through the first separation part P1.

The semiconductor layer 130 may be provided in plurality. Adjacent semiconductor layers among the plurality of semiconductor layers 130 may be apart from each other by a contact part P2 or a second separation part P3. The contact part P2 may be a hole that passes through the semiconductor layer 130 to expose the first electrode 120. The second separation part P3 may be a hole that passes through the semiconductor layer 130 and the second electrode 140 to expose the first electrode 120.

The semiconductor layer 130 may include a silicon-based semiconductor material. In FIGS. 1 and 2, the thin film type solar cell 100 is exemplarily illustrated as including one semiconductor layer 130, but is not limited thereto. That is, the thin film type solar cell 100 according to an embodiment of the present invention may be formed in a tandem structure including the plurality of semiconductor layers 130.

Figure 3:
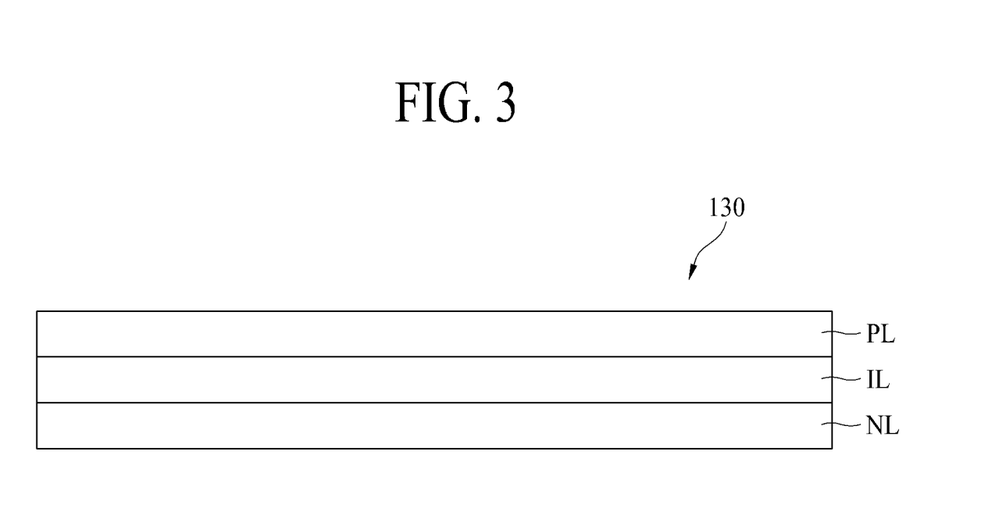
FIG. 3 is a cross-sectional view illustrating a semiconductor layer of FIG. 2 in detail.

The semiconductor layer 130, as illustrated in FIG. 3, may be formed in a PIN structure where a P-type semiconductor layer PL, an I-type semiconductor layer IL, and an N-type semiconductor layer NL are sequentially stacked. If the semiconductor layer 130 is formed in the PIN structure, the I-type semiconductor layer IL may be depleted by the P-type semiconductor PL and the N-type semiconductor layer NL, and thus, an electric field may be generated therein, whereby holes and electrons generated by sunlight may be drifted by the electric field. Therefore, the holes may be collected in the second electrode 140 through the P-type semiconductor layer PL, and the electrons may be collected in the first electrode 120 through the N-type semiconductor layer NL.

The P-type semiconductor layer PL may be disposed close to the second electrode 140, the N-type semiconductor layer NL may be disposed close to the first electrode 120, and the I-type semiconductor layer IL may be disposed between the P-type semiconductor layer PL and the N-type semiconductor layer NL. That is, the P-type semiconductor layer PL may be disposed at a position close to an incident surface onto which the sunlight is irradiated, and the N-type semiconductor layer NL may be disposed at a position far away from the incident surface. This is because a drift mobility of holes is lower than that of electrons. For this reason, in order to maximize collection efficiency based on incident light, the P-type semiconductor layer PL may be disposed close to the incident surface.

The P-type semiconductor layer PL may be formed by doping a P-type dopant on amorphous silicon (a-Si:H), the I-type semiconductor layer IL may be formed of amorphous silicon (a-Si:H), and the N-type semiconductor layer NL may be formed by doping an N-type dopant on amorphous silicon (a-Si:H). However, the present embodiment is not limited thereto.

The second electrode 140 may be formed on the semiconductor layer 130. In more detail, the second electrode 140 may be formed on a surface opposite to a surface contacting the first electrode 120 among surfaces of the semiconductor layer 130. Also, the second electrode 140 may also be formed in the contact part P2. Therefore, the second electrode 140 may contact the first electrode 120 through the contact part P2. The second electrode 140 may be formed of transparent conductive oxide such as ZnO, ZnO:B, ZnO:Al, SnO2, SnO2:F, ITO, or the like.

The second electrode 140 may be provided in plurality. Adjacent second electrodes 140 among the plurality of second electrodes 140 may be apart from each other by the second separation part P3 therebetween. The second separation part P3 may be a hole that passes through the semiconductor layer 130 and the second electrode 140 to expose the first electrode 120. In the thin film type solar cell 100 according to an embodiment of the present invention, the sunlight incident on a lower surface of the substrate 110 may be transmitted through the second separation part P3 as-is. Therefore, the thin film type solar cell 100 may be used as a light transmission type solar cell. The light transmission type solar cell may be applied to windows of buildings, windows and sunroofs of vehicles, etc.

Moreover, the first electrode 120, the semiconductor layer 130, and the second electrode 140 may be apart from each other by a third separation part P4 therebetween. The third separation part P4 may be a hole that passes through the first electrode 120, the semiconductor layer 130, and the second electrode 140 to expose the substrate 110.

Figure 4:
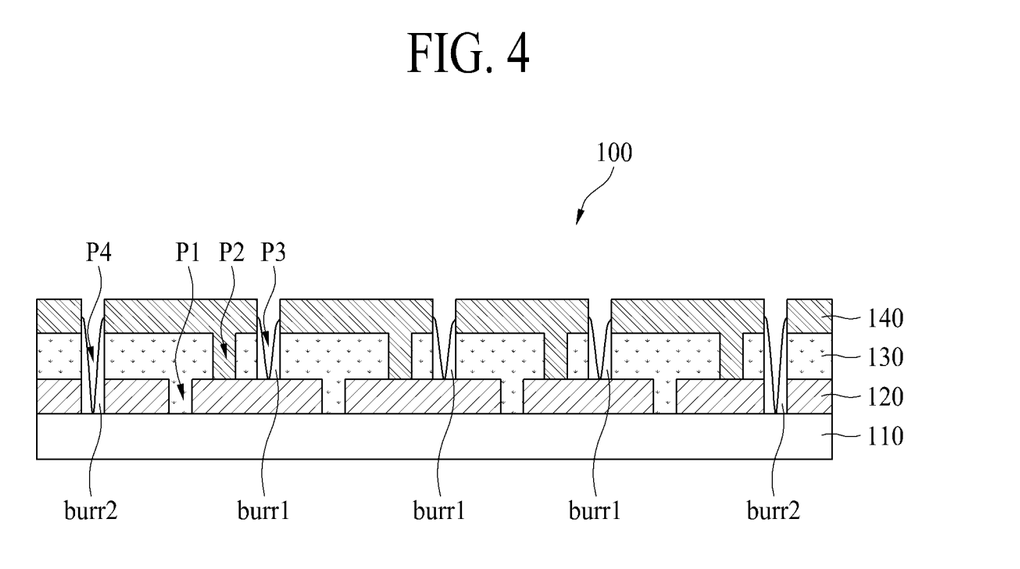
FIG. 4 is a cross-sectional view illustrating a thin film type solar cell where a second electrode is short-circuited with a first electrode due to burrs which are formed in second and third separation parts.

The first to third separation parts P1, P3 and P4 and the contact part P2 may be formed by using a laser. The second separation part P3 may be formed by removing the semiconductor layer 130 and the second electrode 140 with the laser, and in this case, a burr 1 of the second electrode 140 may be piled on the second separation part P3. Particularly, when the burr 1 of the second electrode 140 is piled on the second separation part P3 to higher than a height between the first electrode 120 and the second electrode 140 as in FIG. 4, short circuit between the first electrode 120 and the second electrode 140 can occur due to the burr 1 of the second electrode 140. In this case, a leakage current which flows from the first electrode 120 to the second electrode 140 via the burr 1 without passing through the semiconductor layer 130 can occur, and for this reason, an output of the thin film type solar cell is reduced.

In an embodiment of the present invention, in order to prevent short circuit from occurring between the first electrode 120 and the second electrode 140 due to a burr 1 which is produced in the second separation part P3, the burr 1 which is produced in the second separation part P3 may be wet-etched by using acetic acid. As a result, in an embodiment of the present invention, a height of the burr 1 which is produced in the second separation part P3 may be lower than the height between the first electrode 120 and the second electrode 140. This will be described below in detail with reference to FIGS. 6E and 6H.

Moreover, the third separation part P4 may be formed by removing the first electrode 120, the semiconductor layer 130, and the second electrode 140 with the laser, and in this case, a burr 2 of each of the first electrode 120 and the second electrode 140 may be piled on the third separation part P4. Particularly, when the burr 2 of each of the first electrode 120 and the second electrode 140 is piled on the third separation part P4 to higher than a height between the substrate 110 and the second electrode 140 as in FIG. 4, short circuit between the first electrode 120 and the second electrode 140 can occur due to the burr 2 of each of the first electrode 120 and the second electrode 140. In this case, a leakage current which flows from the first electrode 120 to the second electrode 140 via the burr 2 without passing through the semiconductor layer 130 can occur, and for this reason, the output of the thin film type solar cell is reduced.

In an embodiment of the present invention, in order to prevent short circuit from occurring between the first electrode 120 and the second electrode 140 due to a burr 2 which is produced in the third separation part P4, the burr 2 which is produced in the third separation part P4 may be wet-etched by using acetic acid. As a result, in an embodiment of the present invention, a height of the burr 2 which is produced in the third separation part P4 may be lower than the height between the substrate 110 and the second electrode 140. This will be described below in detail with reference to FIGS. 6F and 6H.

<Method of Manufacturing Thin Film Type Solar Cell>

Figure 5:
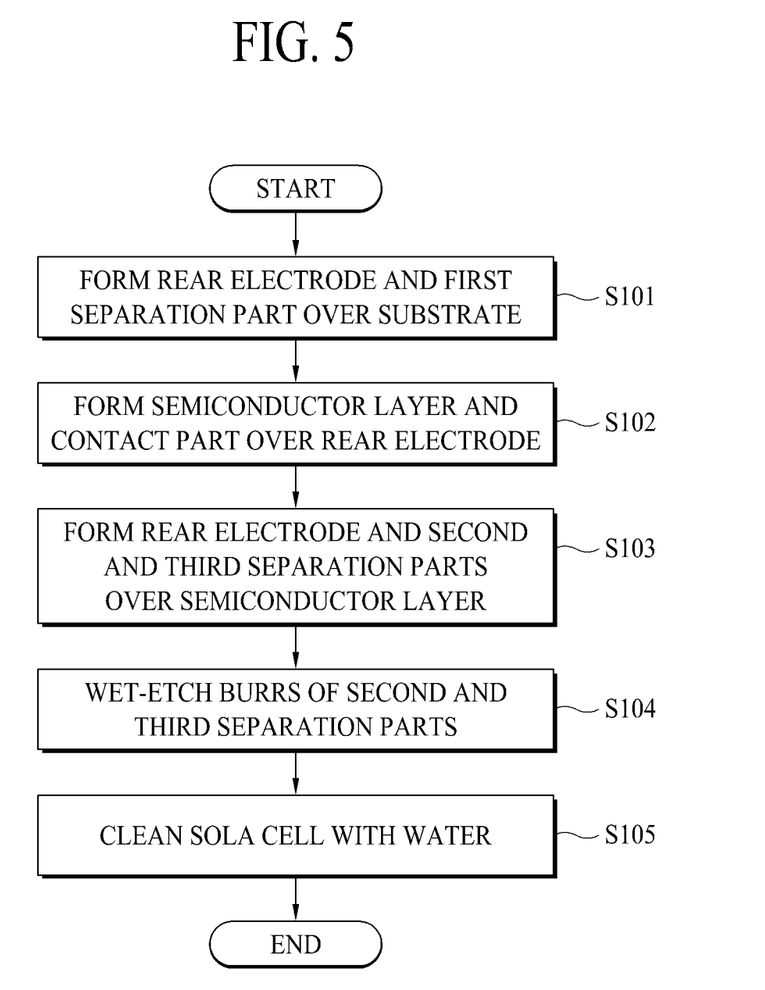
FIG. 5 is a flowchart illustrating a method of manufacturing a thin film type solar cell according to an embodiment of the present invention.

FIG. 5 is a flowchart illustrating a method of manufacturing a thin film type solar cell according to an embodiment of the present invention. FIGS. 6A to 6H are cross-sectional views illustrating a method of manufacturing a thin film type solar cell according to an embodiment of the present invention.

Figure 6A:
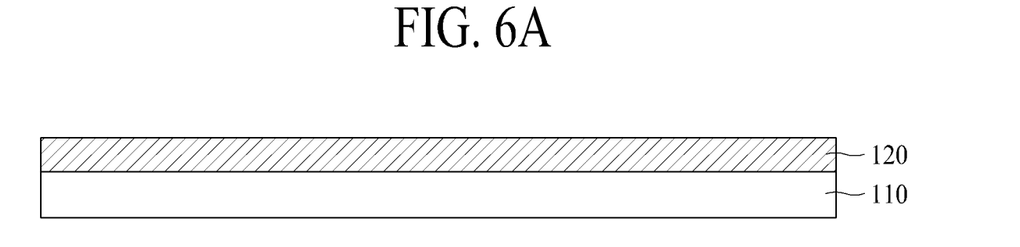
FIGS. 6A to 6H are cross-sectional views illustrating a method of manufacturing a thin film type solar cell according to an embodiment of the present invention.

First, as illustrated in FIG. 6A, the first electrode 120 may be formed on the substrate 110. The first electrode 120 may be formed of transparent conductive oxide, such as ZnO, ZnO:B, ZnO:Al, SnO2, SnO2:F, ITO, or the like, all over the substrate 110 by using a sputtering process, a metal organic chemical vapor deposition (MOCVD) process, or the like.

Since the first electrode 120 is a surface on which sunlight is incident, the first electrode 120 may be formed in a concave-convex structure through a texturing process in order for the incident sunlight to be absorbed into the solar cell as much as possible. The texturing process is for forming a material surface having an uneven concave-convex structure and may be a process of processing the first electrode 120 to have a shape such as a surface of fabric. The texturing process may perform an etching process using a photolithography process, an anisotropic etching process using a chemical solution, or a groove forming process using a mechanical scribing process.

Figure 6B:
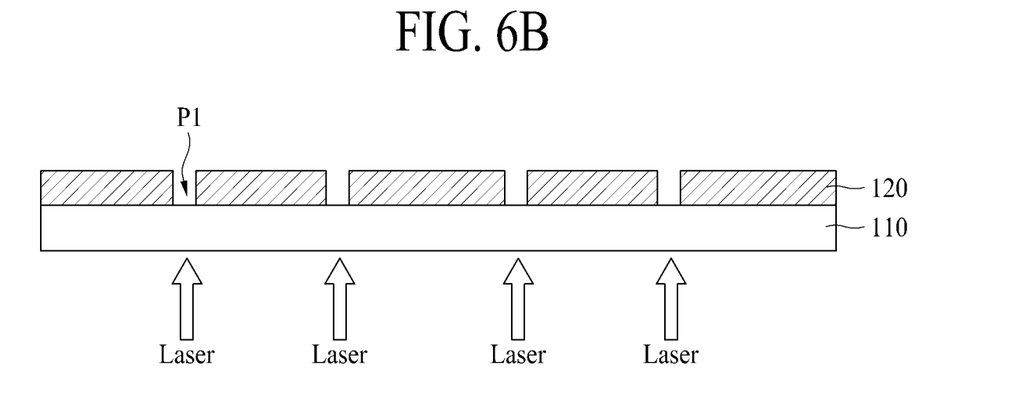

Subsequently, as illustrated in FIG. 6B, the first separation part P1 which passes through the first electrode 120 to expose the substrate 110 may be formed by using the laser. The first electrode 120 may be formed to be apart from an adjacent first electrode 120 by the first separation part P1 therebetween (S101 of FIG. 5).

Figure 6C:
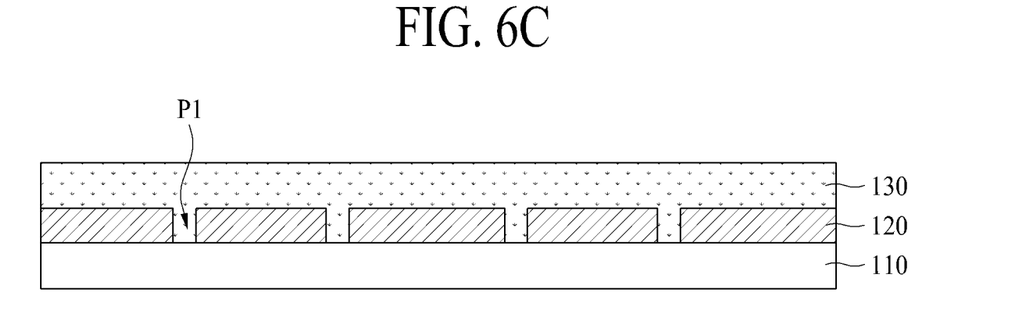

Second, as illustrated in FIG. 6C, the semiconductor layer 130 may be formed on the first electrode 120 and the first separation part P1. The semiconductor layer 130 may be formed of a silicon-based semiconductor material through a plasma chemical vapor deposition (PCVD) process or the like.

In FIG. 6C, the thin film type solar cell 100 is exemplarily illustrated as including one semiconductor layer 130, but is not limited thereto. That is, the thin film type solar cell 100 according to an embodiment of the present invention may be formed in the tandem structure including the plurality of semiconductor layers 130.

Figure 6D:
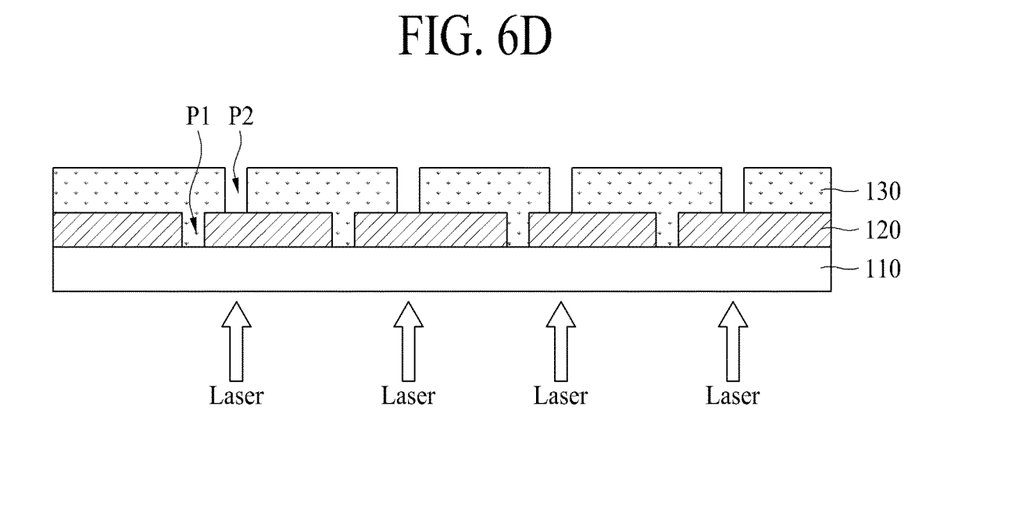

Subsequently, as illustrated in FIG. 6D, the contact part P2 may be formed by punching a hole in the semiconductor layer 130 with the laser. Adjacent semiconductor layers 130 may be formed to be apart from each other by the contact part P2 therebetween (S102 of FIG. 5).

Figure 6E:
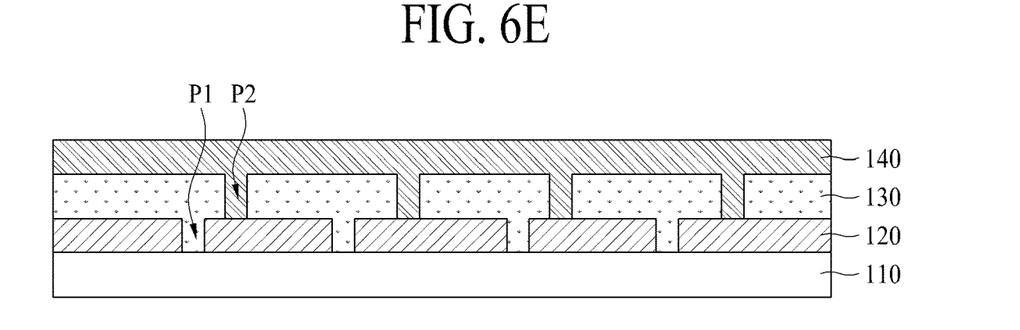

Third, as illustrated in FIG. 6E, the second electrode 140 may be formed on the semiconductor layer 130 and the contact part P2. If the second electrode 140 is formed of transparent conductive oxide such as ZnO, ZnO:B, ZnO:Al, SnO2, SnO2:F, ITO, or the like, the second electrode 140 may be formed through the sputtering process or the MOCVD process. Also, the second electrode 140 may be formed in a concave-convex structure through the texturing process.

Figure 6F:
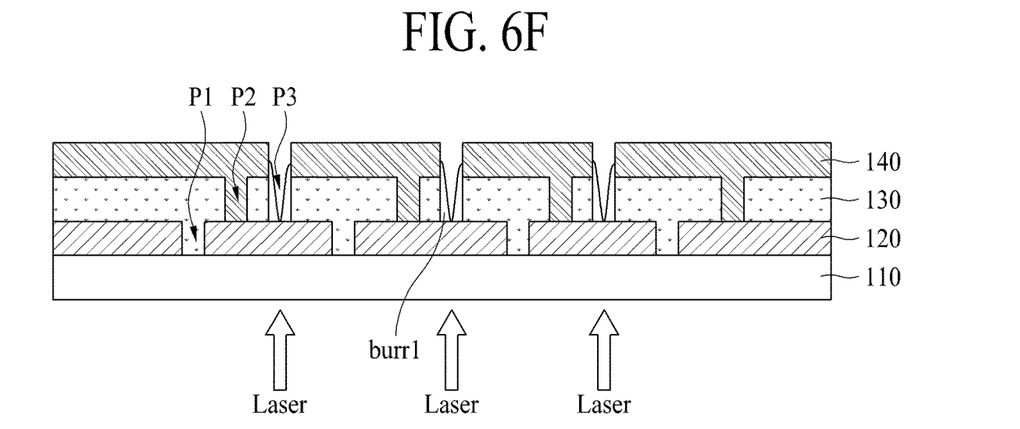

Subsequently, as illustrated in FIG. 6F, the second separation part P3 exposing the first electrode 120 may be formed by punching a hole in each of the semiconductor layer 130 and the second electrode 140 with the laser. The semiconductor layer 130 and the second electrode 140 may be formed to be apart from each other by the second separation part P3 therebetween.

Figure 6G:
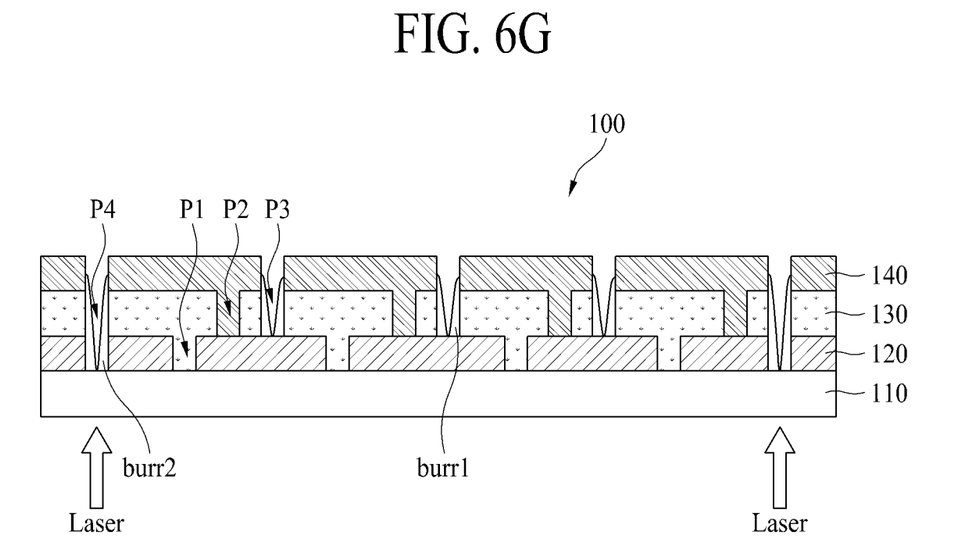

Subsequently, as illustrated in FIG. 6G, the third separation part P4 exposing the substrate 110 may be formed by punching a hole in each of the first electrode 120, the semiconductor layer 130, and the second electrode 140 with the laser. The first electrode 120, the semiconductor layer 130, and the second electrode 140 may be formed to be apart from each other by the third separation part P4 therebetween.

When the second separation part P3 is formed with the laser, the burr 1 of the second electrode 140 may be piled on the second separation part P3. In this case, as illustrated in FIG. 6F, the burr 1 of the second electrode 140 may be piled on the second separation part P3 to higher than the height between the first electrode 120 and the second electrode 140, and short circuit between the first electrode 120 and the second electrode 140 can occur due to the burr 1 of the second electrode 140. Also, when the third separation part P4 is formed with the laser, the burr 2 of each of the first electrode 120 and the second electrode 140 may be piled on the third separation part P4. In this case, as illustrated in FIG. 6G, the burr 2 of each of the first electrode 120 and the second electrode 140 may be piled on the third separation part P4 to higher than the height between the substrate 110 and the second electrode 140, and short circuit between the first electrode 120 and the second electrode 140 can occur due to the burr 2 of each of the first electrode 120 and the second electrode 140. Therefore, a leakage current which flows from the first electrode 120 to the second electrode 140 via the burrs 1 and 2 without passing through the semiconductor layer 130 can occur, and for this reason, the output of the thin film type solar cell is reduced (S103 of FIG. 5).

Fourth, in order to prevent short circuit from occurring between the first electrode 120 and the second electrode 140 due to the burr 1 which is produced in the second separation part P3, the burr 1 which is produced in the second separation part P3 may be wet-etched by using acetic acid (CH3COOH). If the second electrode 140 is formed of ZnO, the burr 1 which is produced in the second separation part P3 includes ZnO. If the burr 1 which is produced in the second separation part P3 includes ZnO, the burr 1 may react as represented by the following Formula 1, based on acetic acid (CH3COOH).

[Formula 1]

$$ZnO(s)+2H^{+}(aq) \rightarrow Zn^{2+}(aq)+H_2O \tag{1}$$

That is, if the burr 1 which is produced in the second separation part P3 includes ZnO, ZnO may react with H+ of acetic acid to generate Zn2+ ion and water (H2O). Therefore, the burr 1 which is produced in the second separation part P3 may be effectively removed by acetic acid (CH3COOH).

Moreover, in order to prevent short circuit from occurring between the first electrode 120 and the second electrode 140 due to the burr 2 which is produced in the third separation part P4, the burr 2 which is produced in the third separation part P4 may be wet-etched by using acetic acid (CH3COOH). If the second electrode 140 is formed of ZnO, the burr 2 which is produced in the third separation part P4 includes ZnO. That is, if the burr 2 which is produced in the third separation part P4 includes ZnO, as represented by Formula 1, ZnO may react with H+ of acetic acid to generate Zn2+ ion and water (H2O). Therefore, the burr 2 which is produced in the third separation part P4 may be effectively removed by acetic acid (CH3COOH).

When acetic acid (CH3COOH) is used as a wet etchant as-is, the second electrode 140 may also be etched by acetic acid (CH3COOH), and for this reason, the output of the thin film type solar cell 100 is reduced. Therefore, acetic acid (CH3COOH) may be diluted with water (H2O) at a certain ratio and used as the wet etchant. In this case, a mole ratio of water (H2O) to acetic acid (CH3COOH) of the wet etchant may be 100 to 150, and particularly, may be 120.

If a mole ratio of water (H2O) to acetic acid (CH3COOH) of the wet etchant is 120, the second electrode 140 and the burrs 1 and 2 may be exposed to the wet etchant for about 30 sec to 120 sec. If the burrs 1 and 2 are exposed to the wet etchant for 30 sec or less, the burrs 1 and 2 are hardly etched. If a duration where the second electrode 140 is exposed to the wet etchant is more than 120 sec, a concave-convex structure of a surface of the second electrode 140 is slightly etched, and for this reason, incident sunlight is reduced in diffusion and increases in reflection, causing a reduction in output of the thin film type solar cell 100. Also, if the duration where the second electrode 140 is exposed to the wet etchant is more than 120 sec, a thickness of the second electrode 140 is reduced, and for this reason, the electrical characteristic of the second electrode 140 is degraded, causing a reduction in output of the thin film type solar cell 100.

When a mole ratio of water (H2O) to acetic acid (CH3COOH) of the wet etchant is adjusted, a duration where the second electrode 140 and the burrs 1 and 2 are exposed to the wet etchant may be adjusted within a range changeable by those skilled in the art.

Figure 6H:
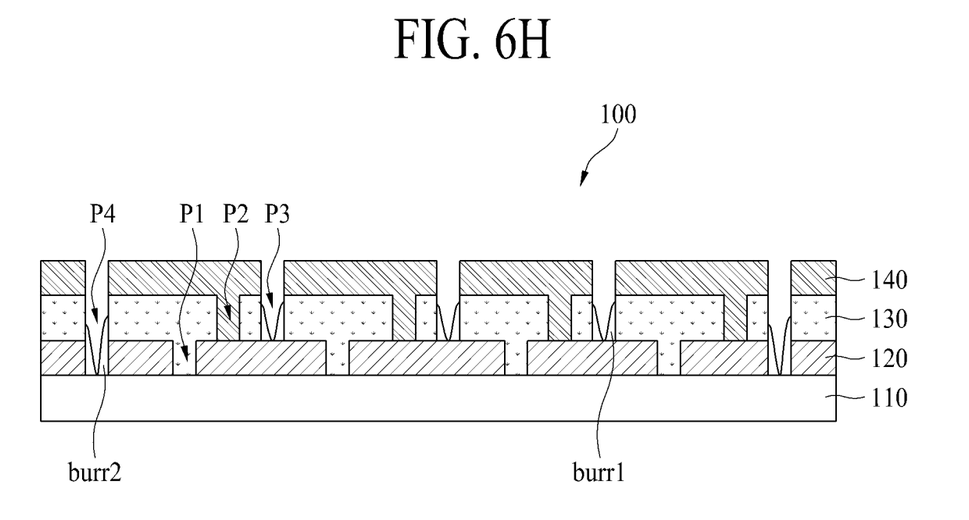

As described above, in an embodiment of the present invention, the burrs 1 and 2 which are respectively produced in the second and third separation parts P3 and P4 may be wet-etched by acetic acid (CH3COOH). As a result, in an embodiment of the present invention, as illustrated in FIG. 6H, a height h1 of the burr 1 which is produced in the second separation part P3 may be lower than a height h2 between the first electrode 120 and the second electrode 140, and a height h3 of the burr 2 which is produced in the third separation part P4 may be lower than a height h4 between the substrate 110 and the second electrode 140. Accordingly, in an embodiment of the present invention, short circuit between the first electrode 120 and the second electrode 140 is prevented from occurring due to the burrs 1 and 2 which are respectively produced in the second and third separation parts P3 and P4 (S104 of FIG. 5).

Fifth, the wet etchant gotten on the second electrode 140 and the burrs 1 and 2 may be removed by cleaning the thin film type solar cell 100 with water (S105 of FIG. 5).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a thin film type solar cell, the method comprising:
   forming a first electrode over a substrate to be apart from an adjacent first electrode by a first separation part;
   forming a semiconductor layer over the first electrode to be apart from an adjacent semiconductor layer by a contact part, the semiconductor layer contacting the substrate through the first separation part;
   forming a second electrode over the semiconductor layer to be apart from an adjacent second electrode by a second separation part, the second electrode contacting the first electrode through the contact part; and
   wet-etching a burr, produced in the second separation part, with a wet etchant including acetic acid,
   wherein the second electrode and the burr comprises a same material, and
   wherein the wet-etching is finished when a height of the burr produced in the second separation part etched by the wet etchant is lower than a height between the first electrode and the second electrode,
   wherein a portion of the burr remains after the wet-etching, and the remaining portion of the burr contacts the first electrode, but does not contact the second electrode.

2. The method of claim 1, further comprising: removing the wet etchant gotten on the burr by using water.

3. The method of claim 1, further comprising:
   punching a hole in each of the first electrode, the semiconductor layer, and the second electrode with a laser to form a third separation part exposing the substrate; and
   wet-etching a burr, produced in the third separation part, with the wet etchant including acetic acid.

4. The method of claim 3, wherein a height of the burr produced in the third separation part is lower than a height between the substrate and the first electrode.

5. The method of claim 3, wherein the first electrode, the semiconductor layer, and the second electrode are apart from each other by the third separation part.

6. The method of claim 1, wherein the forming of the first electrode comprises:
   forming the first electrode over the substrate; and
   punching a hole in the first electrode with a laser to form the first separation part exposing the substrate.

7. The method of claim 1, wherein the forming of the semiconductor layer comprises:
   forming the semiconductor layer over the first separation part and the first electrode; and
   punching a hole in the semiconductor layer with a laser to form the contact part exposing the first electrode.

8. The method of claim 1, wherein the forming of the second electrode comprises:
   forming the second electrode over the contact part and the semiconductor layer; and
   punching a hole in each of the second electrode and the semiconductor layer with a laser to form the second separation part exposing the first electrode.

9. The method of claim 1, wherein the wet-etching of the burr produced in the second separation part is performed for 30 sec to 120 sec with a mole ratio of water (H2O) to acetic acid (CH3COOH) of the wet etchant being 120.

10. The method of claim 3, wherein the wet-etching of the burr produced in the third separation part is performed for 30 sec to 120 sec with a mole ratio of water (H2O) to acetic acid (CH3COOH) of the wet etchant being 120.

* * * * *